United States Patent
Parker

(10) Patent No.: US 6,307,783 B1
(45) Date of Patent: Oct. 23, 2001

(54) DESCENDING STAIRCASE READ TECHNIQUE FOR A MULTILEVEL CELL NAND FLASH MEMORY DEVICE

(75) Inventor: Allan Parker, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/794,485

(22) Filed: Feb. 26, 2001

(51) Int. Cl.[7] .................................................. G11C 16/26
(52) U.S. Cl. ............................... 365/185.21; 365/185.17; 365/185.18; 365/185.19; 365/185.03; 365/168; 365/189.09; 365/189.05; 365/196; 365/195
(58) Field of Search .................... 365/185.21, 185.19, 365/185.18, 185.17, 185.03, 185.33, 168, 189.09, 189.05, 195, 196

(56) References Cited

U.S. PATENT DOCUMENTS

| | | | |
|---|---|---|---|
| 5,761,118 | * 6/1998 | Chai ................................. | 365/185.03 |
| 5,973,959 | * 10/1999 | Gerna et al. ..................... | 365/185.03 |
| 6,166,951 | * 12/2000 | Derhacobian et al. ......... | 365/185.03 |

OTHER PUBLICATIONS

Brian Dipert and Lou Herbert, Intel Corp., "Flash Memory Goes Mainstream", IEEE Spectrum, Oct. 1993, pp. 48–54.
AMD Utilizing UltraNAND Product Brief, "64 Megabit Mass Storage Flash Memory–Utilizing NAND Technology", found at web site http://www.amd.com/products/nvd/overview/ultranand/22294.html.

* cited by examiner

Primary Examiner—Andrew Q. Tran

(57) ABSTRACT

A multi-level memory includes an array of memory cells accessible through respective word lines and bit lines a control circuit controlling embedded operations of the memory and a read voltage generating circuit to generate a descending staircase read voltage to a word line associated with a selected memory cell under control of the control circuit. The multi-level memory further includes a read circuit including a latch circuit, and a switch circuit responsive to an evaluate/enable signal to selectively store a read state signal in the latch circuit in response to a sense signal generated from application of the descending staircase read voltage to the word line associated with the selected memory cell.

21 Claims, 5 Drawing Sheets

| STORED STATE | | | | STORED STATE | | | | STORED STATE | | | | RD_STATE |
|---|---|---|---|---|---|---|---|---|---|---|---|---|
| E | 0 | 1 | 2 | E | 0 | 1 | 2 | E | 0 | 1 | 2 | |
| X | X | X | X | 1 | 1 | 1 | 1 | 11 | 11 | 11 | 11 | 1 | 0 |
| Vss | Vss | Vss | Vcc | 1 | 1 | 1 | 0 | 10 | 10 | 11 | 11 | X |
| Vss | Vss | Vcc | Vcc | 1 | 1 | 0 | 0 | 01 | 01 | 10 | 11 | 1 | 0 |
| Vss | Vcc | Vcc | Vcc | 1 | 0 | 0 | 0 | 00 | 01 | 10 | 11 | 0 | 0 |
| SENSE | | | | EVAL_ENB | | | | Q1 Q0 | | | | 0 | 0 |

PRESET

DESCENDING STAIRCASE READ TECHNIQUE FOR A MULTILEVEL CELL NAND FLASH MEMORY DEVICE

RELATED APPLICATIONS

This application is related to application serial number xx/xxx,xxx entitled Ascending Staircase Read Technique For a Multilevel Cell NAND Flash Memory Circuit, filed on even date herewith and commonly assigned to the assignee of the present application and incorporated herein by reference.

BACKGROUND

The present invention relates generally to memory devices. More particularly, the present invention relates to a descending staircase read technique for a multi-level cell NAND flash memory device.

A variety of semiconductor memory devices have been developed for storage of information. Examples include volatile and nonvolatile memory. Nonvolatile memory provides a key advantage in that it retains stored data after power is removed from the device. One example of nonvolatile memory is flash memory. However, manufacture and operation of nonvolatile memory is generally more complex than for volatile memory. For all memory devices, important design goals include increased storage density and reduced read and write times.

A conventional memory device includes an array of storage cells or memory cells. Each cell stores a single binary digit or bit of information. For example, in a flash memory, the threshold voltage of a transistor in the memory cell is adjusted according to the data stored. During a read cycle, the threshold voltage is sensed to resolve the state of the data stored. In a conventional binary memory, this data is conventionally described as having a state of logic 0 or logic 1. The array of storage cells is surrounded by circuits for reading and writing data and controlling operation of the memory device.

Recently, multi-level cells have been developed. Multi-level storage refers to the ability of a single memory cell to store or represent more than a single bit of data. A multi-level cell may store 2, 4, 8. . . etc., bits in a single storage location.

Multi-level cell devices provide a substantial advantage by exponentially increasing the storage capacity of a memory device. However, multi-level cell devices present several challenges for developing circuit designs to access the memory cells. One such challenge is reliably and rapidly reading the data stored in a multi-level storage cell.

BRIEF SUMMARY

By way of introduction only, a multi-level memory includes an array of memory cells accessible through respective word lines and bit lines, a control circuit controlling embedded operations of the memory and a read voltage generating circuit to generate a descending staircase read voltage to a word line associated with a selected memory cell under control of the control circuit. The multi-level memory further includes a read circuit including a latch circuit, and a switch circuit responsive to an evaluate/enable signal to selectively store a read state signal in the latch circuit in response to a sense signal generated from application of the descending staircase read voltage to the word line associated with the selected memory cell.

The foregoing discussion of the preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

Figure 1:
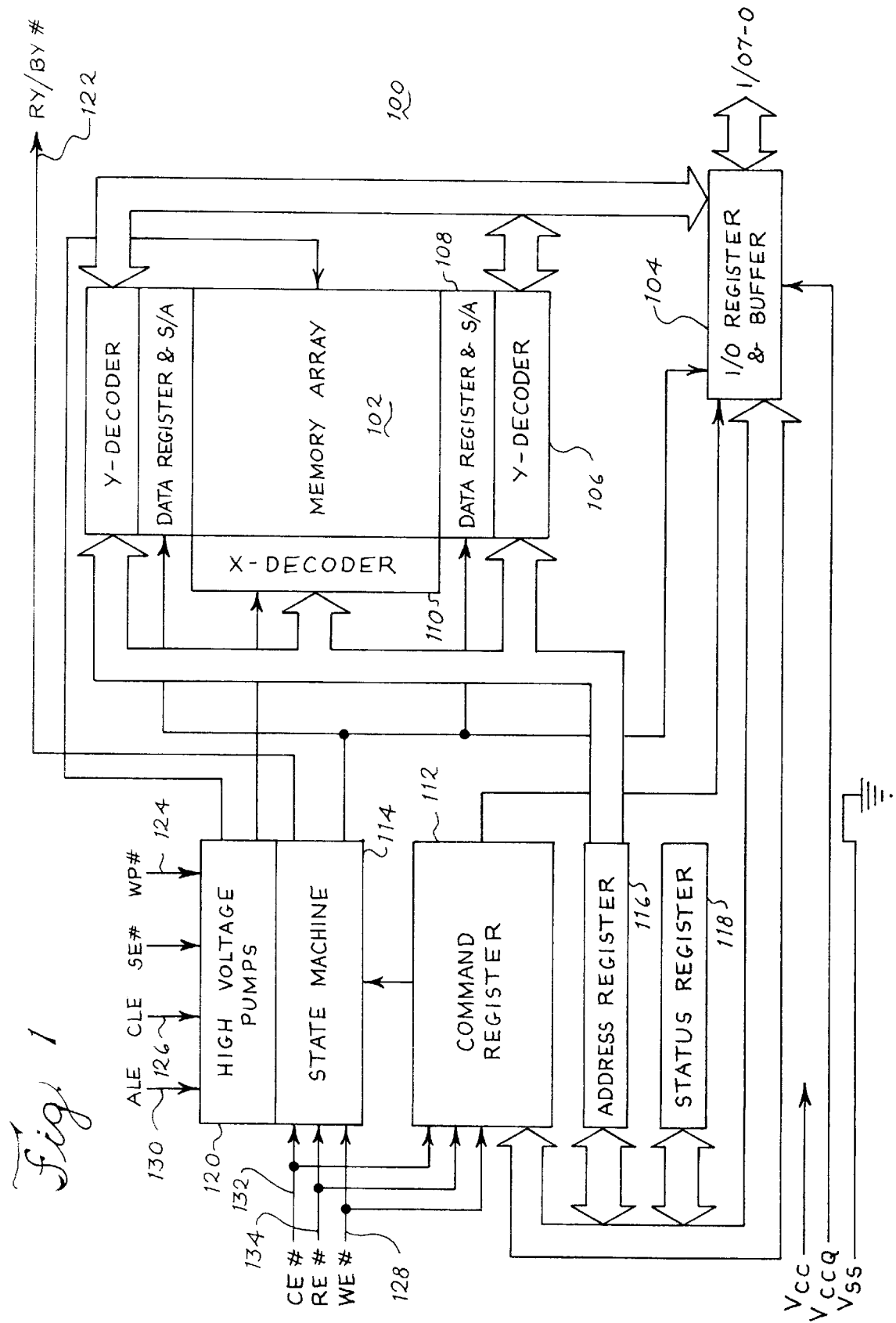
FIG. 1 is a block diagram of a memory device.

Referring now to the drawing, FIG. 1 shows a block diagram of a memory device 100. The memory device 100 in the illustrated embodiment is a NAND flash memory. However, in other embodiments, the memory device 100 may be any other suitable type of volatile memory such as random access memory (RAM) including static or dynamic RAM or nonvolatile memory such as EEPROM. Further, the memory device 100 may be an embedded memory circuit within another integrated circuit or device containing other circuitry, such as logic. As a flash memory, the memory device 100 may be written or programmed with data, read to retrieve the stored data, and erased to clear the memory device on a block-by-block basis.

In the illustrated embodiment, the memory device 100 includes a memory cell array 102, an input/output (I/O) register 104, one or more Y-decoders 106, one or more sense amplifier blocks 108 and one or more X-decoders 110. Further, the memory device 100 includes a command register 112, a state machine 114, an address register 116, a status register 118 and a high voltage circuit 120. Other embodiments of the memory device 100 may include other components or omit some of those illustrated in FIG. 1.

The memory cell array 102 includes a plurality of memory cells arranged in an ordered array of rows and columns. Each memory cell is independently addressable and may be programmed or written with data and read or sensed. In response to a received address, the X-decoder 110 selects one or more rows of the memory cell array 102 for access. Similarly, the Y-decoder 106 selects one or more columns of the memory cell array 102 for access. Sense amplifiers in the sense amplifier block 108 detect the state of the data stored in the accessed memory cell or cells. Data registers of the sense amplifier block 108 store data immediately prior to writing or immediately after reading the accessed memory cell or cells.

Address information and data to be stored, along with commands for controlling operation of the memory device 100, are provided to the memory device 100 using the I/O register 104 in a time multiplexed manner known in the art. Commands are written to the command register 112 using the I/O register 104. Address information corresponding to one or more memory cells to be accessed is stored in the address register 116. Status information is stored in the status register 118. Register contents serve as inputs to the state machine 114 which controls read, erase and programming of the memory device 100. The state machine 114 performs embedded operations to complete reading, erasing and programming automatically without user interaction.

Reading data is done according to standard NAND flash operation. A starting address is provided to the I/O register 104 along with the appropriate command. The associated memory cells are accessed and a page of data is transferred to the I/O register 104. A page may be any suitable size, such as 264 bytes. The 264 bytes in this example includes 256 bytes of storage area and 8 bytes of spare area. After an initial page read access time, such as 6 microseconds, the memory device 100 under control of the state machine 114 automatically increments the address register to the next address location in response to a received clock signal.

Erasing operations are performed on a block basis. A block may be any suitable size, such as 16 rows by 256 words per row. The state machine 114 initiates an embedded erase algorithm to automatically time erase pulse widths and verify proper cell erase margin.

The memory device 100 signals completion of an operation such as a read, write or erase using a read/busy pin 122. The signal at the ready/busy pin 122 indicates operation status of the memory device 100. When this signal is high, the memory device 100 is ready to accept commands and data for a next operation. When the signal at the pin 122 is low, an internal operation is in progress.

To complete the identification of elements shown in FIG. 1, the high voltage circuit 120 generates the voltages necessary for proper reading, programming and erasure of the memory device 100. The memory device 100 operates in response to power supply (Vcc and Vccq) and ground (Vss) voltages. Typical power supply voltage is 3.0 volts, but other voltages may be used.

A write protect input pin 124 provides hardware data protection. When a write protect signal is asserted at pin 124, program and erase operations are inhibited.

A command latch enable (CLE) pin 126 receives a signal which controls activation of the command register 112 for the receipt of commands. When this signal is high, the command is latched into the command register 112 on the rising edge of the write enable signal received at the write enable pin 128. A signal at an address latch enable (ALE) input 130 controls activation of the address register 116 during a data input operation. When the ALE signal is high, the address information is latched on the rising edge of the write enable signal at pin 128. When ALE is low, the input data information is latched on the rising edge of the write enable signal. The signal at the chip enable input 132 controls the mode, either active or standby, of the memory device 100. The signal at the read enable input 134 controls serial data output and status from the input/output lines. Lastly, the signal at the spare area enable input 136 controls access to a spare storage area on each page. When the spare area signal is high, the spare area is not enabled.

Figure 2:
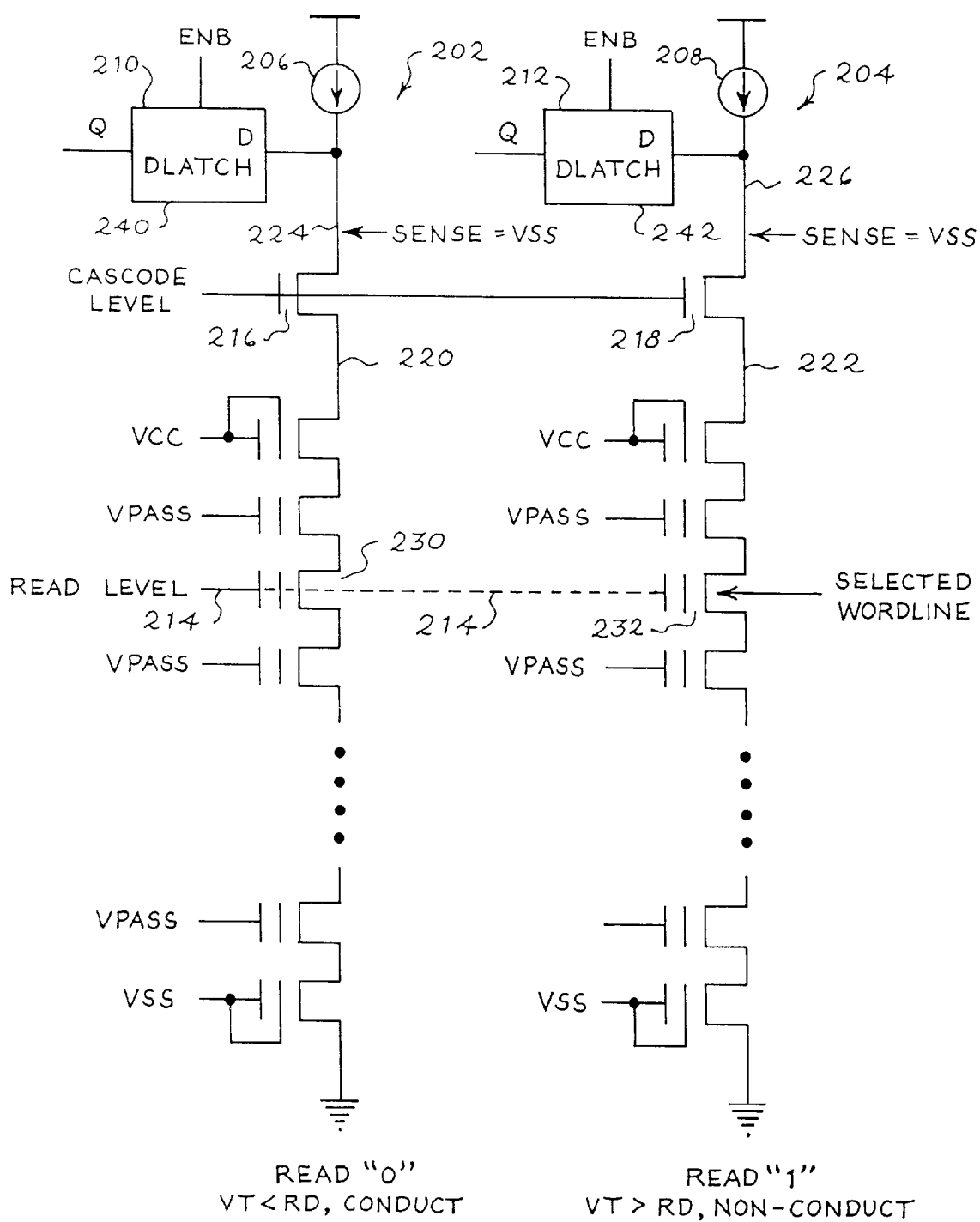
FIG. 2 is a simplified block diagram illustrating a read operation in the memory device of FIG. 1.

FIG. 2 is a simplified block diagram illustrating a read operation in the memory device of FIG. 1. FIG. 2 shows two columns including a first column 202 and a second column 204 of the memory cell array 102. Each column 202, 204 includes a column current source 206, 208, respectively, bit line buffer logic 210, 212 respectively, a cascode transistor 216, 218, and a plurality of memory cells.

The cascode transistors 216, 218 have respective sources coupled to the bit lines 220, 222, respectively, and respective drains coupled to the sense lines 224, 226. The gates of the cascode transistors 216, 218 are coupled to a reference potential. The cascode transistors 216, 218 form cascode amplifiers to amplify the current in the bit line due to a selected memory cell for sensing at the sense lines 224, 226.

As noted above in connection with FIG. 1, the memory cells are arranged in an array of rows and columns. In a typical embodiment, there are 16 memory cells per column and 264×8 memory cells per row. Memory cells are further organized in pages, blocks and sectors. The rows are interconnected by word lines including a word line 214 shown in FIG. 2.

As illustrated schematically in FIG. 2, each memory cell of the flash memory includes a floating gate for storage of charge. By controlling the charge stored on the floating gate, the threshold voltage of the memory cell is adjusted. When the voltage on the word line is raised above the threshold voltage of the memory cell, the memory cell transistor conducts current. For reading the data stored in a selected memory cell, other transistors in the column are supplied with a voltage Vpass so that these transistors act as pass transistors, conducting the current sunk in the memory cell to the bit lines 220, 222. This current is amplified by the cascode transistors 216, 218.

Two examples of reading data are illustrated in FIG. 2. In column 202, transistor 230 is selected by driving the word line 214 to a read voltage. This same voltage is applied to all memory cells coupled to the word line 214, such as transistor 232 in column 204. In the memory cell 230, the threshold voltage Vt of the cell is less than the applied read voltage (RD). Therefore, the memory cell 230 will conduct a read current on the order of a few microamps. This current in the bit line 220 is amplified by the cascode transistor 216 and the sense line 224 is pulled low to a voltage of approximately Vss. The bit line buffer circuitry 210, embodied here as a D latch 240, will store the state of the sense line 224 and the data may be read from the latch 240.

In column 204, the threshold voltage Vt of the memory cell 232 is greater than the applied read voltage (RD) on the word line 214. As a result, the memory cell 232 will conduct substantially no current. With no current in the bit line 222, the voltage on the sense line 226 remains high or approximately Vcc. Again, the bit line buffer circuitry 210 is embodied as a D latch 242 which stores the state of the sense line 226 for subsequent reading.

Figure 3:
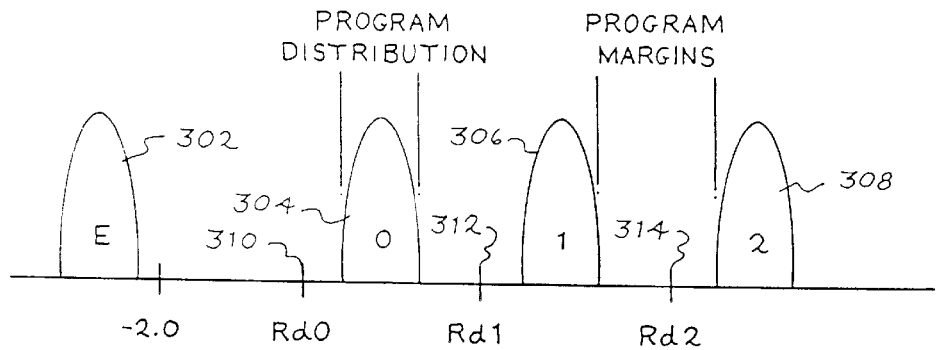
FIG. 3 illustrates relative threshold voltage levels for storing data in a multi-level memory cell of the memory device of FIG. 1.

FIG. 3 illustrates relative threshold voltage levels for storing data in a multi-level memory cell of the memory device of FIG. 1. In the example of FIG. 3, the number of bits stored per cell is N=2 so the number of possible threshold voltage values is 2 to the power of N or 4. It is recognized that during the programming operation, a programmed threshold voltage in a given memory cell will actually fall within a program level voltage distribution of voltages about a nominal or mean voltage. Thus, the example threshold voltage levels are shown as four program level voltage distributions. The distributions and their associated data states are as shown in FIG. 3. The erased data state or E has the most negative programmed threshold voltage in a distribution 302 so that erased memory cells will always conduct when their associated word line is selected or driven to a relatively high voltage level. A data state of 0 has the next highest programmed threshold voltage, in a distribution 304. A data state of 1 has the next highest programmed threshold voltage, in a distribution 306. A data state of 1 has the highest programmed threshold voltage, in a distribution 308. FIG. 3 also illustrates the program margins between the individual program voltages. It is to be noted that FIG. 3 is exemplary only for the case where the multi-level memory cell stores N=4 possible levels. The programmed threshold voltages and distributions for other implementations involving other possible stored levels will vary from those shown in FIG. 3.

FIG. 3 further shows the read levels required to resolve the data stored in a given memory cell. A first read level 310 labelled Rd0 is used to discriminate the stored 0 data from an erased state. That is, a voltage Rd0 is applied to the word line of the memory cell to be sensed. If the memory cell stores an erased state E, the threshold voltage of the memory cell will be in the distribution 302 and therefore less than the applied voltage Rd0. The memory cell will conduct current. On the other hand, if the memory cell stores the data 0 state, the threshold voltage will be in the distribution 304 and therefore greater than the applied voltage Rd0. The memory cell will not conduct current or will conduct only leakage current. Similar conditions apply for using a read voltage Rd1 to discriminate the stored date 1 state, with a threshold voltage in the distribution 306, from the stored data 0 state with a threshold voltage in the distribution 304, and using a read voltage Rd2 to discriminate the stored data 2 state, with a threshold voltage in the distribution 308, from the stored data 1 state, with a threshold voltage in the distribution 306. In accordance with the present embodiments, a descending staircase read signal with levels substantially equal to voltage Rd2, Rd1 and Rd0 is applied to a selected memory cell to distinguish possible stored voltages in a memory cell.

Figure 4:
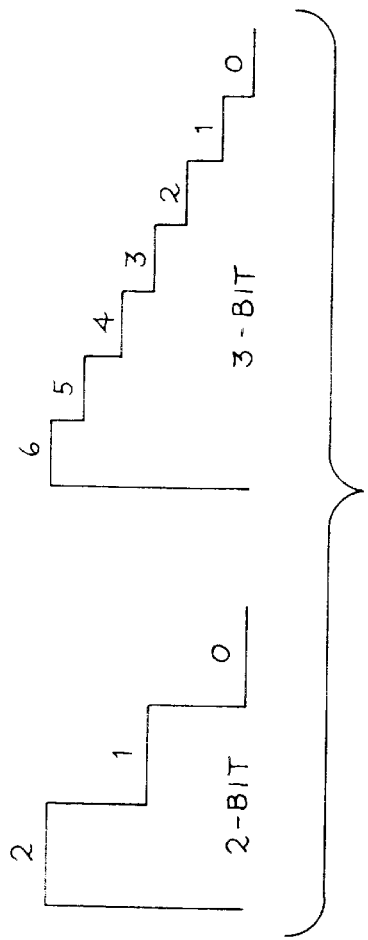
FIG. 4 illustrates two examples of a descending stair case read pulse signal for reading data in a multi-level memory cell.

FIG. 4 illustrates two examples of a descending stair case read pulse signal for reading data in a multi-level memory cell. The descending stair case read pulse signal may be applied under control of a control circuit such as the state machine 114 (FIG. 1) to a selected word line to resolve the data stored in one or more memory cells on the selected word line. In each example, the stair case read pulse signal increments from an initial level to a final level in substantially equal steps. In FIG. 4, the stair case read pulse signals are shown as voltages plotted against time. However, it is to be understood that any suitable stair case signal such as a current or other electrical parameter established by one or more circuit or logic elements could be used. Further, in the exemplary embodiment of FIG. 4, each step of the 2N total steps is generally equal in voltage and in time duration, where N is the number of bits stored in the multi-level memory cell. It is further to be understood that pulses which vary in size or duration may be substituted in appropriate designs.

Figure 5:
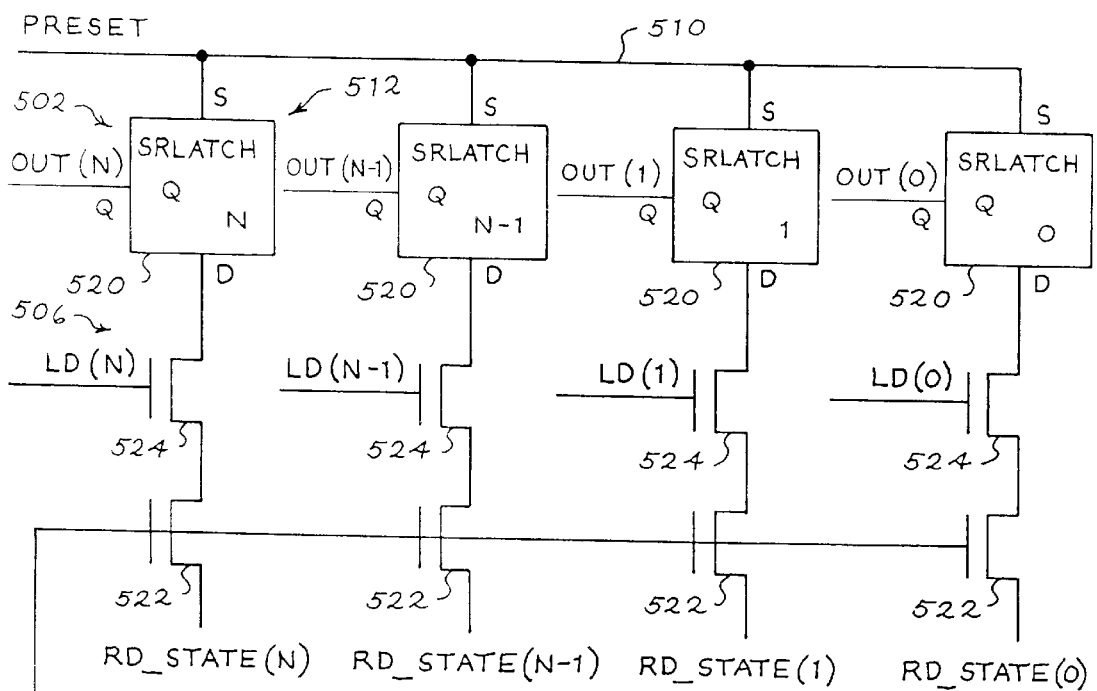
FIG. 5 illustrates bit line buffer logic in the memory device of FIG. 1.
Figure 5:
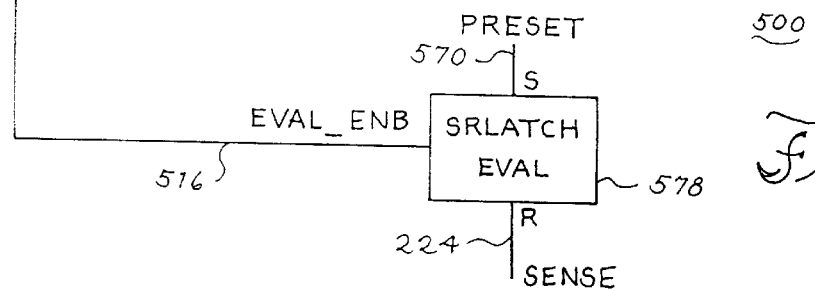

FIG. 5 is a block diagram of bit line buffer logic 500 for use with the memory device 100 of FIG. 1. The bit line buffer logic 500 includes a latch circuit 502, a switch circuit 504, a load circuit 506 and a sense latch 518. The bit line buffer logic 500 receives as inputs a sense signal on sense line 224, a read state signal RD_STATE(N:0) on a read state bus 508 and a preset signal on a preset line 510. The bit line buffer logic 500 provides as an output an N-bit output signal Q(N:0) on an output bus 512. The output signal is a binary signal associated with the stored level in the memory cell currently being sensed by the sense line 224. The output signal may be provided to other circuits of the memory 100 (FIG. 1), for example, the I/O register 104 as output data read from the memory device 100.

The latch circuit 502 includes N latches 520, where N is the number of possible levels stored in a memory cell of the memory device 100 (FIG. 1). Each latch 520 is generally identical in the illustrated embodiment. Each latch 520 is a delay or D-type latch and has a data input labeled D, a data output labeled Q and a set input labeled S. In response to a preset signal received at the set input, the data stored in the latch 520 is initialized to a predetermined value. In the illustrated embodiment, the predetermined value corresponds to a logic 1 value. When a data signal is provided to the data input, the logic value is stored in the latch 520 and made available at the data output Q.

As noted, in the illustrated embodiment, D-type latches are used to form the latch circuit 502. In other embodiments, other types of storage devices could be used as well. Examples include master-slave flip flops and simple devices such as flash memory cells. Selection of a storage device for use in the bit line buffer logic 500 may be made according to performance and control requirements.

The switch circuit 504 includes a plurality of switch transistors 522. In the illustrated embodiment, the switch transistors 522 are formed using n-channel field effect transistors having a gate coupled to an evaluate/enable line 516, a drain coupled to the load circuit 506 and a source coupled to the read state bus 508. In alternative embodiments, other devices could be used to form the switch circuit 504 to provide additional control or performance features. N-channel transistors are preferred because of their fast switching speed and small size.

The switch circuit 504 is responsive to a sense voltage on the evaluate/enable line 516 for selectively storing values of the read state signal on the read state bus 508. The switch circuit 504 allows the data stored in a selected multi-level memory cell to be resolved.

The switch circuit 504 controls storage in the latch circuit 502 in response to the value on the evaluate/enable line 516. The value on the evaluate/enable line 516 is typically either Vcc or Vss, the supply voltages of the memory device 100. The value on the evaluate/enable line 516 is determined by the data stored in the sense latch 518.

The sense latch 518 in the illustrated embodiment is a set-reset or SR latch. Other types of memory or logic circuitry may be used to provide the same or similar functionality. The sense latch 518 has a set input which receives the preset signal on the line 510. The sense latch 518 has a reset input which receives the sense signal on the line 224. The sense latch 518 has an output to provide the evaluate/enable signal on the evaluate/enable line 516. The data stored in the sense latch 518 will depend on the value on the sense line 224.

The sense latch 518 is needed in conjunction with the descending stair case read voltage to prevent the data in the latches 520 from being overwritten after proper values have been read. The stored Erase level produces all logic 0 levels in the latches 520. The read state bus indicates the level being evaluated. As the read state bus increments, along with the read voltage applied to the selected word line, the read state bus will write to the latches if the sense signal is at Vcc and the evaluate/enable signal is at logic 1.

Initially, at the start of a read cycle, the preset signal is asserted to set all the latches 520 and the sense latch 518 to a predetermined value such as logic 1. Subsequently, during the read cycle, as read voltages are applied to the word line and a selected memory cell, the value on the sense line 224 may change. In response the value on the evaluate/enable line 516 may change to control the storage or updating of data in the latch circuit 502.

The value on the sense line 224 will be Vss if the threshold voltage of the selected memory cell is less than the read voltage applied on the selected word line. In that case, the sense signal will not reset the sense latch to a logic 0. The sense latch 518 will remain set due to the assertion of the preset signal. The value on the evaluate/enable line 516 will be Vcc and the switch transistors 522 will be turned on. The data from the read state bus 508 will be passed through the switch transistors 522. In the other state, the value on the sense line 224 will be Vcc if the threshold voltage of the selected memory cell is greater than the read voltage applied on the selected word line. In that case, the sense signal will reset the sense latch 518 and the evaluate/enable signal on the evaluate/enable line 516 will have a value of Vss. The switch transistors 522 will be turned off and no value will pass through the switch transistors 522 from the read state bus 508 to the load circuit 506.

The load circuit 506 includes load transistors 524. The load transistors 524 each have a gate coupled to a load bus labeled LD(N) through LD(0), a source coupled with the drain of a corresponding switch transistor 522 and a drain coupled with the data input D of a corresponding data latch 520. When the load signal LD(N:0) at the gate of the load transistor 524 is driven to a logic 1 value, the load transistor 524 turns on, coupling the corresponding switch transistor 522 to the corresponding latch 520. If both the evaluate/enable signal on the evaluate/enable line 516 and the respective load signal have a logic 1 value, data bits from the read state bus 508 are loaded into the D-type latches 520 of the latch circuit 502.

The load circuit 506 is shown including only n-channel transistors. Again, this is preferred for small size and fast operation. In other embodiments, other devices may be used to perform the function of the switch circuit 506. In addition, in the embodiment of FIG. 5, the load signal is shown as a multi-bit signal LD(N:0) having 4 bits, one for each latch 520. In alternative embodiments, the load signal may be a single binary signal which controls all switch transistors 524.

In operation, at the beginning of a read cycle, the preset signal is asserted at the set inputs of the latches 520 and the sense latch 518. This initializes to all logical 1 values the data stored in the latch circuit 502 and the sense latch 518 and presented at the output bus Q(N:0) and the evaluate/enable line 516. In the illustrated embodiment, this all-ones value corresponds to a stored 2 level in the selected multi-level memory cell. Other default values could be chosen. However, the choice illustrated here reduces the number of values of the ascending staircase read voltage that must be applied to resolve the data stored in the multi-level memory cell.

The state machine 114 (FIG. 1) forms a control circuit or control means for controlling a read cycle. Other on-chip or off-chip circuitry or hardware combined with software can perform the same or equivalent function. During the read cycle, the state machine 114 applies a variable read voltage to a word line associated with the selected memory cell. The state machine 114 controls a circuit such as the high voltage circuit 120 (FIG. 1) to generate a variable voltage which steps through the levels or values of the descending staircase read voltage appropriate for the memory device 100, such as those illustrated in FIG. 4. The state machine 114 provides the necessary control signals to control generation of appropriate voltage levels with appropriate timing.

Substantially simultaneously, the state machine 114 provides counterpart values to the read state bus RD_STATE (N:0). The read state signal is applied with a value related to the read voltage applied to the word line associated with the selected memory cell.

Figure 6:
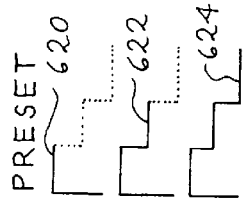
FIG. 6 is a table illustrating voltages and logic states during application of a stair case read pulse signal for reading data in a multi-level memory cell of the memory device of FIG. 1.

This operation is illustrated in FIG. 6, which is a table illustrating voltages and logic states during application of a descending stair case read pulse signal for reading data in a multi-level memory cell of the memory device of FIG. 1. In the example of FIG. 6, N=2. The applied read voltage 602 is illustrated on the left hand side of FIG. 6. The applied read state bus logic levels RD_STATE(1) and RD_STATE(0) 604 are illustrated on the right hand side of FIG. 6. The four columns 606 to the left of the center of FIG. 6 illustrate the value of the sense line 224 for each possible stored level in the selected memory cell, E, 0, 1, 2. The four columns 608 at the center of FIG. 6 illustrate the state of the evaluate/enable signal for each possible stored level, E, 0, 1, 2, of the selected memory cell at respective values of the descending stair case read voltage. The four columns 610 to the right of the center of FIG. 6 illustrate the data produced at the outputs Q1, Q0 of the latches 520.

Initially, the preset signal is applied to the latches 518, 520, setting their stored values to all logic 1 values. During preset, the state of the sense signal is not read so it is shown in FIG. 6 with values of X or don't care for each of the possible stored levels, E, 0, 1, 2.

Next during the read cycle, a read voltage with a first or highest voltage at a first step 620 is applied to the selected word line. If the stored state in the selected memory cell is Erase or E, the sense signal on the sense line 224 will have the value Vss. In this case, the Erase threshold voltage is less than the applied read voltage and the memory cell conducts, pulling the voltage on the sense line 224 to a logic 0 value. This logic 0 value does not reset the sense latch, which remains set at a logic 1 value. That is the value of the evaluate/enable signal. The read state bus has value (1,0).

Since the evaluate/enable signal has a logic 1 value, the switch transistors 522 (FIG. 5) turn on and the data in the latches 520 follows the read state bus. In the same way, if the stored level in the selected memory cell is 0 or 1, the evaluate/enable signal has a logic 1 value and the (1,0) value of the read state bus is loaded into the latches 520. Alternatively, if the stored level in the selected memory cell is 2, the sense signal on the sense line 224 has the value Vcc as the memory cell threshold voltage exceeds the applied read voltage on the word line. The sense latch 518 is reset and the evaluate/enable signal has a logic 0 value. This does not turn on the switch transistors 522 and so the latches 520 are not updated.

At this read voltage level, the corresponding read state signal is (1,0). The data value of (1,0) on the read state is passed by the switch circuit 504 and the load circuit 506 and latched in the latch circuit 502 when the evaluate/enable signal has a value of logic 1.

Next during the read cycle, the variable read voltage applied to the word line is advanced to a next or second step or voltage 622. At this value of the descending staircase read signal, the word line voltage exceeds the memory cell threshold voltage if the memory cell stores either an Erase or 0 level. In these two cases, then, the sense signal value is Vss and the evaluate/enable signal has a logic 1 value. If the stored level is 1 or 2, the sense signal value is Vcc and the evaluate/enable has a logic 0 value.

At this read voltage level, the corresponding read state signal is (0,1). Thus, when the load signal is applied to the load transistors 524, the value of the read state signal will be loaded into the latches 520 if the stored level is an Erase or 0. If the stored data is a 1 or 2 level, the latched data will be unchanged.

During the final portion of the read cycle, the variable read voltage applied to the word line is advanced to a next or third step or voltage 624. At this value of the ascending staircase read signal, the word line voltage exceeds the memory cell threshold voltage only if the memory cell stores an Erase level. In this case, then, the sense signal value is Vss. If the stored level is 0, 1 or 2, the sense signal value is Vcc. Correspondingly, the evaluate/enable signal will have a logic 1 value only if an Erase level is stored. Otherwise, if a 0, 1 or 2 level is stored in the selected memory cell, the evaluate/enable signal will have a logic 0 value.

At this read voltage level, the corresponding read state signal is (0,0). Thus, when the load signal is applied to the load transistors 524, the value of the read state signal will be loaded into the latches 520 if the stored level is an Erase level. If the stored data is a 0,1 or 2 level, the latched data will be unchanged.

Figure 7:
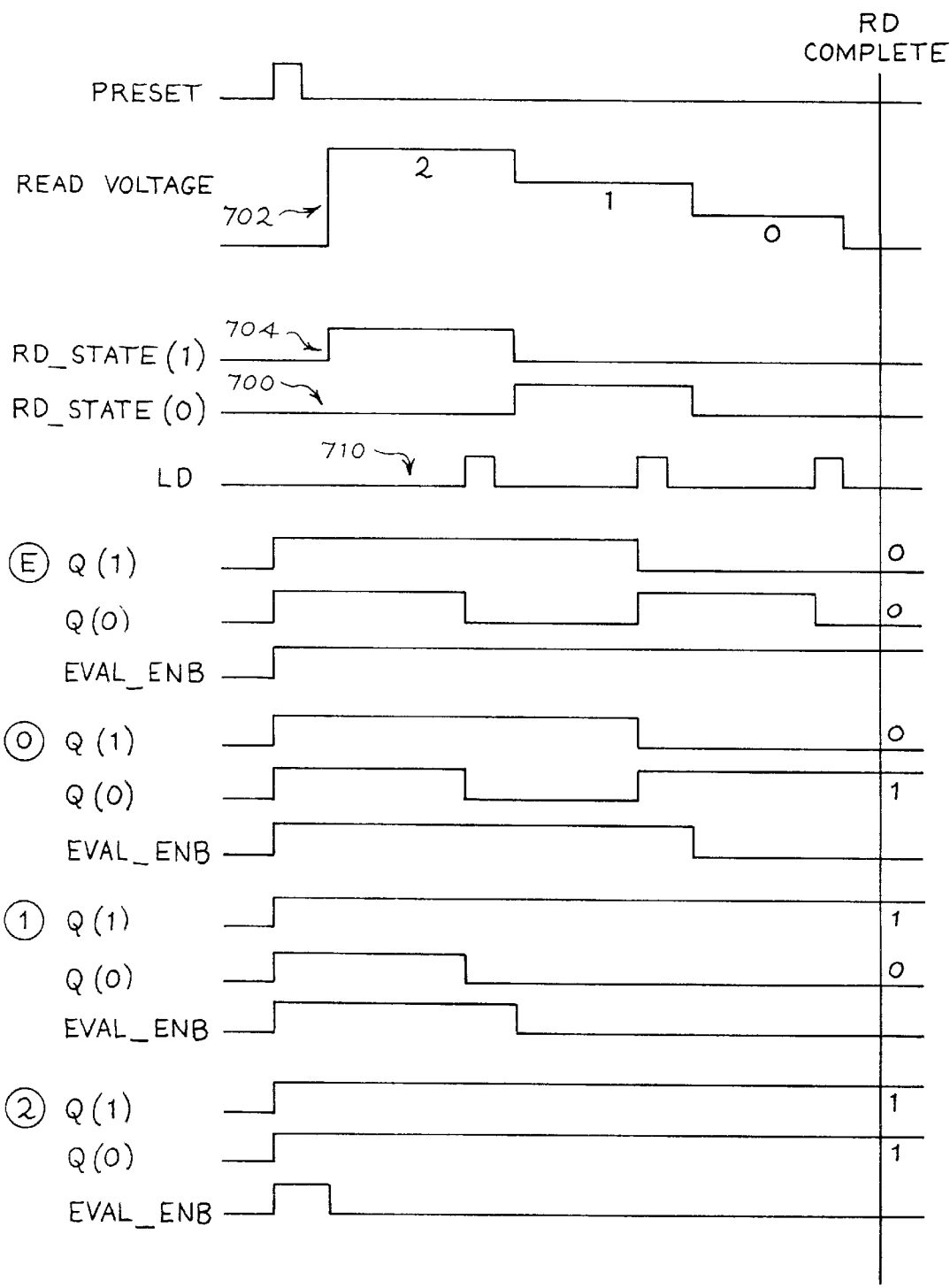
FIG. 7 is a timing diagram illustrating read operation of the memory device of FIG. 1.

FIG. 7 is a timing diagram illustrating read operation of the memory device 100 of FIG. 1. FIG. 7 illustrates several voltage signals versus time during a read cycle of the memory device 100. FIG. 7 is best understood in conjunction with the bit line buffer logic 500 of FIG. 5.

In FIG. 7, a read voltage or gate voltage 702 is applied to the selected word line 214 as a descending staircase read pulse signal. A read state signal having two components, RD_STATE(1) 704 and RD_STATE(0) 706 is applied with a value or respective values related to the read voltage 702. At the end of each portion of the read cycle, a load pulse 710 of the load signal LD 708 is applied to the load transistors 524 of the load circuit 506 to load the data from the switch circuit 504 to the latch circuit 502. A preset signal 712 initiates a read cycle by pulsing to a logic 1 to set all the latches 518, 520.

The lower portion of FIG. 7 illustrates the latched and output data values (Q1, Q0) for the N=$2^N$ different possible stored levels in the selected memory cell. Thus, for example, if the stored level is a level 2, Q1 and Q0 are initially preset to logic 1 values and remain unchanged thereafter throughout the duration of the read cycle. If the stored level is other than an Erase, the stored values are updated with each load pulse as shown in FIG. 7. At the end of the read cycle, on the right hand side of FIG. 7, the data stored in the multi-level memory cell is available for reading.

From the foregoing, it can be seen that the present embodiments provide an improved technique for resolving the data stored in a multi-level memory cell. An ascending staircase read signal is applied to the selected word line and an associated read state signal is applied to the bit line buffer logic to store the sense signals produced in response to the read signal. The staircase read technique provides a significant advantage by reducing the bit line buffer circuitry. There is no need for feedback between logical bits as in prior designs. In one embodiment, the circuit reduction accounts for twenty to thirty percent area savings in the bit line buffers, which is important for reducing the manufacturing cost of the memory device. Further, performance is improved as the staircase read technique encounters bit line preparation, setup time and hold time penalties only once per read cycle. This results in significant read access time savings for the memory device. The staircase read scheme is scalable to any multi-level cell density, such as 2, 3, 4, etc., times the initial number of stored levels per memory cell. The shape of the staircase read voltage may be controlled through the state machine of the memory and thus can be easily modified.

While a particular embodiment of the present invention has been shown and described, modifications may be made. For example, the sense of the individual transistors, p-channel and n-channel, may be reversed in suitable applications or other technologies may be substituted. It is therefore intended in the appended claims to cover all such changes and modifications which fall within the true spirit and scope of the invention.

What is claimed is:

1. A method for resolving data stored in a multi-level memory, the method comprising:
   applying a descending staircase voltage to a selected word line of the memory;
   detecting a sense signal due to the descending staircase voltage associated with a memory cell coupled to the selected word line;
   updating a stored data level for each read voltage of the descending staircase voltage; and
   providing the updated stored data as the resolved data.

2. The method of claim 1 wherein applying a descending staircase voltage comprises:
   sequentially applying a plurality of read voltages to the selected word line, each read voltage selected to distinguish first and second possible stored levels in the memory cell.

3. The method of claim 2 wherein sequentially applying a plurality of read voltages comprises:
   applying a first read voltage to the selected word line, the first read voltage having a value greater than a first program level voltage distribution and less than a second program level voltage distribution; and
   applying subsequent read voltages to the selected word line to distinguish other program level voltage distributions until N−1 read voltages have been applied to distinguish N possible stored levels in the memory cell.

4. The method of claim 2 wherein detecting comprises:
   establishing an evaluate/enable signal in response to the sense signal; establishing a read state signal having a plurality of values, each value corresponding to a read voltage of the plurality of read voltages;
   applying the read state signal to a switch circuit controlled by the evaluate/enable signal; and
   latching values of the read state signal when the evaluate/enable signal has a predetermined value of the plurality of values.

5. The method of claim 4 further comprising:
   initializing latches of a latch circuit to an initial data value, the latches storing the values of the read state signal in response to the evaluate/enable signal; and
   initializing a sense latch to a predetermined value, the sense latch establishing the evaluate/enable signal in response to the sense signal.

6. The method of claim 1 wherein updating comprises:
   incrementing a read state signal to a next value; and
   latching the read state signal as the stored data level for a next read voltage of the descending staircase voltage.

7. A method for reading data from a multi-level memory, the method comprising:
   applying a descending staircase voltage to a selected word line of the memory, the descending staircase voltage including a sequence of read voltages chosen to distinguish possible stored levels in an accessed memory cell coupled to the selected word line;
   detecting a sense signal produced in response to the descending staircase voltage at the memory cell; and
   producing output data in response to the sense signal.

8. The method of claim 7 further comprising:

initializing to an initial value latches for storing output data for the accessed memory cell; and updating the value stored in the latches for each read voltage of the sequence of read voltages.

9. The method of claim 8 wherein initializing comprises presetting the latches to a default value corresponding to one possible stored level in the accessed memory cell.

10. The method of claim 9 wherein the default value corresponds to a Erase level stored in the accessed memory cell.

11. The method of claim 9 wherein producing the output data comprises providing values stored in the latches.

12. The method of claim 8 wherein updating comprises:

providing a read state signal having one value of a plurality of read state values, each read state value corresponding to a respective read voltage of the sequence of read voltages; and in response to the sense signal, selectively storing the read state signal in the latches.

13. The method of claim 12 further comprising:

storing a sense value in a sense latch;

providing contents of the sense latch as an enable signal; and storing the read state signal in the latches when the enable signal has a first value.

14. The method of claim 13 further comprising:

disabling further updates to the sense latch once a valid stored level has been determined from the accessed memory cell.

15. The method of claim 14 further comprising:

presetting the sense latch to an initial value before applying the descending staircase voltage; and selectively resetting the sense latch in response to the sense signal to disable further updates to the sense latch.

16. A multi-level memory comprising:

an array of memory cells accessible through respective word lines and bit lines;

a control circuit controlling embedded operations of the memory;

a read voltage generating circuit to generate a descending staircase read voltage to a word line associated with a selected memory cell under control of the control circuit; and a read circuit including
a latch circuit, and
a switch circuit responsive to an evaluate/enable signal to selectively store a read state signal in the latch circuit in response to a sense signal generated from application of the descending staircase read voltage to the word line associated with the selected memory cell.

17. The multi-level memory of claim 16 further comprising a read state generating circuit which generates the read state signal with a plurality of values, each respective read state value being associated with a read voltage of the descending staircase read voltage.

18. The multi-level memory of claim 16 further comprising:

a sense latch coupled to the switch circuit to produce the evaluate/enable signal in response to the sense signal.

19. The multi-level memory of claim 18 wherein the sense latch comprises:

a set input configured to receive a preset signal to preset the evaluate/enable signal to an initial value; and a reset input configured to receive the sense signal to reset the evaluate/enable signal to a disable value.

20. A memory device comprising:

a plurality of memory cells, each memory cell capable of storing one of N possible levels;

decoding means for selecting a word line associated with a selected address and a sense line associated with the selected address;

control means operational during a read mode for applying consecutive values of a descending staircase read voltage to the selected word line and providing consecutive values of a multi-bit read state signal; and logic means coupled to the control means and the decoding means for storing in a memory means for storing data respective values of the read state signal for each respective value of the descending staircase read voltage.

21. The memory device of claim 20 wherein the logic means comprises:

sense latch means for storing an evaluate/enable value produced in response to bit line current in a memory cell selected by application of a respective read voltage to the selected word line; and switch means responsive to the evaluate/enable value for selectively updating the memory means with a value of the read state signal associated with the respective read voltage.

* * * * *